(12) United States Patent
Dalton et al.

(10) Patent No.: US 6,734,096 B2
(45) Date of Patent: May 11, 2004

(54) FINE-PITCH DEVICE LITHOGRAPHY USING A SACRIFICIAL HARDMASK

(75) Inventors: Timothy J. Dalton, Ridgefield, CT (US); Minakshisundaran B. Anand, Germantown, MD (US); Michael D. Armacost, San Jose, CA (US); Shyng-Tsong Chen, Patterson, NY (US); Stephen M. Gates, Ossining, NY (US); Stephen E. Greco, LaGrangeville, NY (US); Simon M. Karecki, deceased, late of Brooklyn, NY (US), by Anna Karecki, administratrix; Satyanarayana V. Nitta, Poughquag, NY (US)

(73) Assignee: International Business Machines Corporation, Armonk, NY (US)

( * ) Notice: Subject to any disclaimer, the term of this patent is extended or adjusted under 35 U.S.C. 154(b) by 32 days.

(21) Appl. No.: 10/053,288

(22) Filed: Jan. 17, 2002

(65) Prior Publication Data

US 2003/0134505 A1 Jul. 17, 2003

(51) Int. Cl.$^7$ .......................................... H01L 21/4763
(52) U.S. Cl. ....................... 438/624; 438/634; 438/637; 438/692; 438/717; 438/736
(58) Field of Search .................... 438/624, 634, 438/637, 692, 717, 736; 257/637, 643, 642, 649, 760, 774

(56) References Cited

U.S. PATENT DOCUMENTS

| 6,019,906 A | 2/2000 | Jang et al. ....................... 216/2 |
| 6,066,569 A | 5/2000 | Tobben ....................... 438/717 |
| 6,121,150 A | 9/2000 | Avanzino et al. ........... 438/692 |
| 6,140,226 A | 10/2000 | Grill et al. .................. 438/637 |
| 6,162,587 A | 12/2000 | Yang et al. .................. 430/314 |
| 6,165,695 A | 12/2000 | Yang et al. .................. 430/314 |
| 6,503,840 B2 * | 1/2003 | Catabay et al. ............. 438/694 |
| 6,537,908 B2 * | 3/2003 | Fornof et al. ............... 438/638 |
| 2002/0052125 A1 * | 5/2002 | Shaffer, II et al. .......... 438/780 |

FOREIGN PATENT DOCUMENTS

JP          10-92791       4/1998     ....... H01L/21/3065

OTHER PUBLICATIONS

U.S. application No. 09/550,943, Dalton et al., submitted by applicants.*

U.S. appl. No. 09/550,943, filed Apr. 17, 2000, entitled "Protective Hardmask for Producing Interconnect Structures", Dalton et al.

* cited by examiner

Primary Examiner—Hsien Ming Lee
(74) Attorney, Agent, or Firm—Jay H. Anderson

(57) ABSTRACT

A method is described for forming a metal pattern in a low-dielectric constant substrate. A hardmask is prepared which includes a low-k lower hardmask layer and a top hardmask layer. The top hardmask layer is a sacrificial layer with a thickness of about 200 Å, preferably formed of a refractory nitride, and which serves as a stopping layer in a subsequent CMP metal removal process. The patterning is performed using resist layers. Oxidation damage to the lower hardmask layer is avoided by forming a protective layer in the hardmask, or by using a non-oxidizing resist strip process.

17 Claims, 5 Drawing Sheets

US 6,734,096 B2

FINE-PITCH DEVICE LITHOGRAPHY USING A SACRIFICIAL HARDMASK

RELATED APPLICATION

This application is related to U.S. application Ser. No. 09/550,943 filed Apr. 17, 2000, entitled "Protective hardmask for producing interconnect structures," and assigned to the same assignee as the present application. The disclosure of the related application is incorporated herein by reference.

FIELD OF THE INVENTION

This invention relates to semiconductor processing, and more particularly to critical dimension control in deep submicron lithography for fabrication of interconnects in a dual damascene process.

BACKGROUND OF THE INVENTION

Devices with multilevel interconnect structures have become well known in the semiconductor industry. The dual damascene process has proven to be a successful method for building such structures. This process generally involves embedding metal lines in an interlevel dielectric (ILD) layer, and connecting metal layers by metallizing via holes formed in the ILD. In order to improve the electrical performance of the overall device, it is highly desirable that the ILD have a low dielectric constant (k<4). In addition, in very fine-pitch (<300 nm) devices, the lines and via holes must be etched into the ILD with a critical dimension of about 100 nm. This generally requires that the etch be performed with a hardmask. Furthermore, it is often desirable for part of the hardmask to remain on the ILD, to avoid a mask removal process which might damage the ILD; this layer is sometimes called a "residual hardmask" or "permanent hardmask." Accordingly, the hardmask layer in contact with the low-k ILD should also have a low dielectric constant.

A typical hardmask for formation of lines and vias in the ILD is shown schematically in FIG. 1A. The ILD 10 is disposed on a barrier layer 1, which in turn covers the underlying level (not shown). The ILD is generally formed of a polymer such as an organic polyarylene ether thermoset dielectric, or a similar material. The hardmask includes three layers 11–13. Permanent hardmask layer 11 is formed of a low-k material (k<4.5); examples of such materials are organosilicates such as SiCOH (containing Si, C, O and H); SiC; SiC:H; and amorphous Si containing C and H. Layer 11 is covered by layer 12, typically silicon nitride; thicknesses of layers 11 and 12 are approximately 500 Å and 350 Å respectively. Layer 13 is typically silicon dioxide with a thickness of approximately 1500 Å. The pattern for the metal lines is transferred to layer 13 ("line-level" lithography), resulting in formation of exposed areas 2 in the mask, as shown in FIG. 1B. Further processing involves depositing a layer of resist 14 which is patterned to define via openings 4 ("via-level" lithography), as shown in FIG. 1C. This requires that the resist 14 be at least partially planarized over the topography introduced by patterning layer 13. Layer 13 is also subject to faceting (that is, formation of facets 3), which leads to loss of critical-dimension control. The fidelity of the pattern transfer is also degraded by roughening of the line edge, caused by deposition thereon of plasma polymers.

Furthermore, as shown in FIG. 1D, in subsequent processing the etched lines and via openings are overfilled with metal 16 (often with a liner 15); the excess metal must then be removed, typically by chemical-mechanical polishing (CMP). If the metal 16 and liner material 15 are removed by CMP at nearly the same rate (for example, when metal 16 is copper and liner 15 is tungsten), the remaining hardmask must also function as a polish stop layer. The thin layer 12 of silicon nitride may not be effective as a CMP stop layer.

There is a need for an improved dual damascene process in which the hardmask structure permits processing with very high fidelity pattern transfer while retaining the advantages of low dielectric constant, and includes an effective CMP stopping layer.

SUMMARY OF THE INVENTION

The present invention addresses the above-described need by providing a dual damascene process using a hardmask structure including a sacrificial hardmask layer and which eliminates at least the oxide layer overlying the low-k dielectric layer.

In accordance with a first aspect of the invention, a method is provided in which three hardmask layers (lower, middle and top) are deposited on a low-k substrate. The top hardmask layer has a thickness less than about 200 Å. A first opening is formed in the top hardmask layer in accordance with a first pattern, thereby exposing a portion of the middle hardmask layer. A second opening is formed in that portion of the middle hardmask layer in accordance with a second pattern and a corresponding opening in the lower hardmask layer, thereby exposing a portion of the substrate. An opening is formed in the substrate, and metal is deposited therein. Excess metal may be deposited over the hardmask and then removed. Finally, the top hardmask layer is removed.

The material of the top hardmask layer may be a refractory metal, a refractory metal nitride, a refractory metal alloy or a conductive Si-based material such as doped Si or doped amorphous Si, and is preferably a refractory metal nitride such as TaN. The middle hardmask layer is preferably SiN. The excess metal may be removed by CMP, with the top hardmask layer having a lower polishing rate than the excess metal being polished.

It should be noted that the process of forming the first opening may include depositing a resist layer on the top hardmask layer and subsequently removing the resist layer therefrom; the middle hardmask layer protects the lower hardmask layer from oxidation during removal of the resist layer.

In accordance with a second aspect of the invention, a method is provided in which a lower hardmask layer and a top hardmask layer are deposited. A protective layer is formed in a region of the lower hardmask layer adjacent to the top surface thereof; this protective layer protects the lower hardmask layer from oxidation when the resist removal is performed. The protective layer may be formed by exposing the lower hardmask layer to a plasma treatment which either forms a protective nitride layer in the top surface region, or densifies the lower hardmask layer in that region. The protective layer has a thickness of approximately 100 Å.

In accordance with an additional aspect of the invention, a method is provided in which a lower hardmask layer and a top hardmask layer are deposited on the substrate. A first opening is formed in the top hardmask layer in accordance with a first pattern, thereby exposing a portion of the lower hardmask layer. This process includes depositing a resist layer on the top hardmask layer and subsequently removing the resist layer therefrom; the resist layer is removed in a non-oxidizing resist strip process, so that oxidation of the lower hardmask layer is avoided. In particular, the resist may be removed in a plasma resist strip process with a reducing chemistry.

It is noteworthy that the top hardmask layer is a thin sacrificial layer which can also serve as a CMP stopping layer, and that oxidation damage to the lower hardmask layer (which generally is of a low-k material) is avoided.

DETAILED DESCRIPTION OF THE PREFERRED EMBODIMENTS

The hardmask structure of the present invention uses a thin (approximately 100–200 Å) sacrificial layer which overlies and protects the low-k dielectric hardmask layer, is an effective mask for etching the pattern of metal lines, and also provides an effective polishing stop in the metal CMP process.

First Embodiment: Three-Layer Hardmask

Figure 1A:
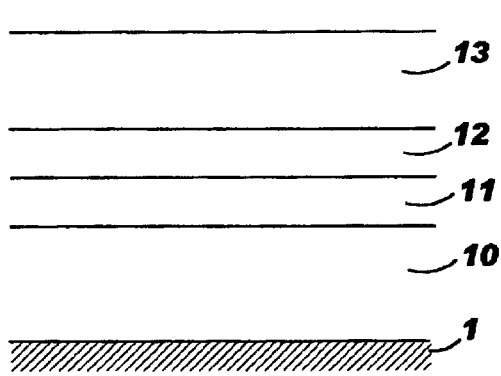
FIG. 1A is a schematic illustration of a typical hardmask structure used in dual damascene processing.
Figure 1B:
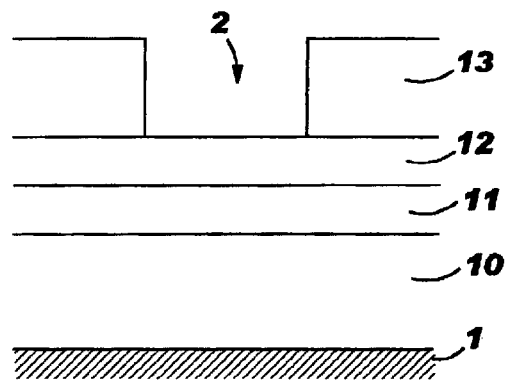
FIGS. 1B–1D illustrate some of the processing difficulties encountered using the hardmask of FIG. 1A.
Figure 2A:
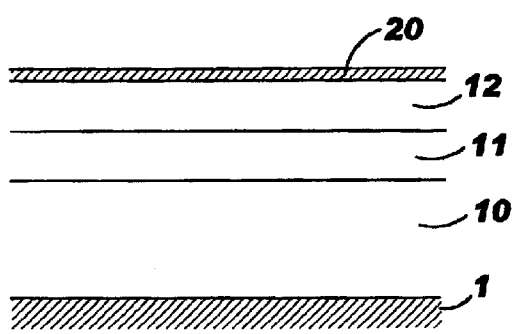
FIGS. 2A–2H illustrate a dual damascene process using a three-layer hardmask in accordance with a first embodiment of the invention.

The structure of the hardmask of this embodiment is shown in FIG. 2A. A thin hardmask layer 20 is used in place of the oxide layer 13 of the conventional hardmask (compare FIG. 1A) and is the top layer of the three-layer hardmask structure. The underlying residual hardmask includes layer 11 and layer 12. The middle layer 12 is generally of a dielectric material having properties that are not degraded during typical processing steps (e.g. etching with a resist mask, resist strip, wet cleaning). This dielectric material may be $SiO_2$, SiN, SiON, SiOF, or a similar material known in the art. The bottom layer 11 is generally of a low-dielectric-constant material such as SiC, SiC:H, an organosilicate (e.g. SiCOH), SiCNH, a spin-on silosesquioxane, carbon-doped oxide, organosilicate glass, silicon oxycarbide, amorphous hydrogenated silicon carbide, amorphous hydrogenated silicon carbide/nitride, or a similar suitable material. It will be appreciated that this layer is subject to damage in various typical processing steps, and therefore requires a protective layer (in this case, dielectric layer 12). In particular, the low-k layer 11 must be protected from oxidation during deposition of layer 20 and during resist strip processes (e.g. during resist rework).

Layer 20 may be a metal, metal compound or alloy, semiconductor or dielectric, provided at least that (i) the deposition of layer 20 does not damage the underlying layers, and in particular does not alter the desirable electrical properties of layers 10 and 11; and (ii) the polishing rate of layer 20 is low compared to that of the excess metal removed by CMP. Layer 20 is preferably a refractory metal (e.g. Ta, Ti, W), a refractory metal nitride (e.g. TaN, TiN, WN), a refractory metal alloy (e.g. TaSiN, TiSiN, WSiN, TiW), a conductive Si-based material such as doped Si or doped amorphous Si, or some other metal (e.g. Cu, Al, Ag). More preferably, layer 20 is formed of a refractory metal nitride. In particular, it has been found that a 150 Å layer of TaN provides good pattern fidelity while maintaining the desirable properties of layers 10 and 11.

In this embodiment, the ILD layer 10 is formed of an organic polyarylene ether thermoset dielectric; the residual hardmask layers 11 and 12 are SiC and SiN respectively; and layer 20 is formed of TaN. Layers 11 and 12 may be formed by chemical vapor deposition (CVD) or plasma enhanced CVD. Layer 11 may also be deposited in a spin-on process. Layer 20 may be formed by physical vapor deposition or CVD.

Figure 1C:
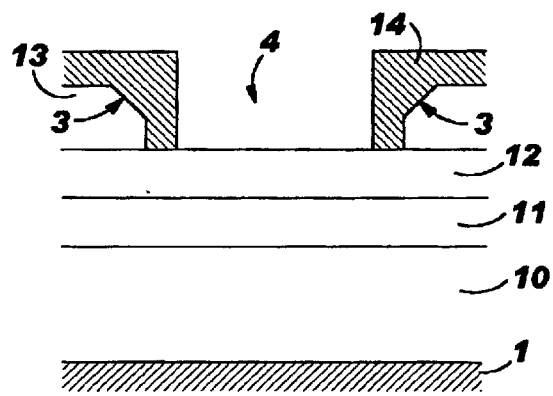
Figure 1D:
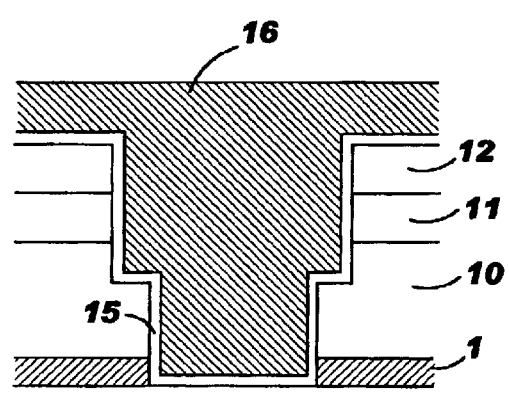
Figure 2B:
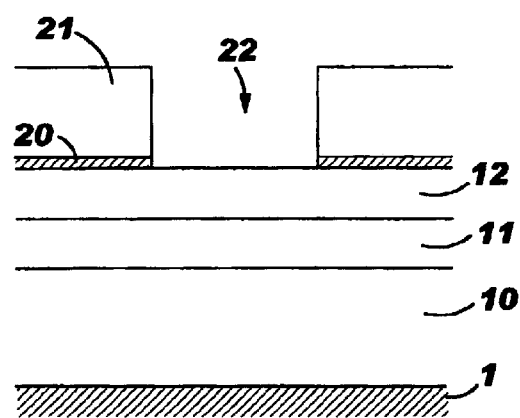
Figure 2C:
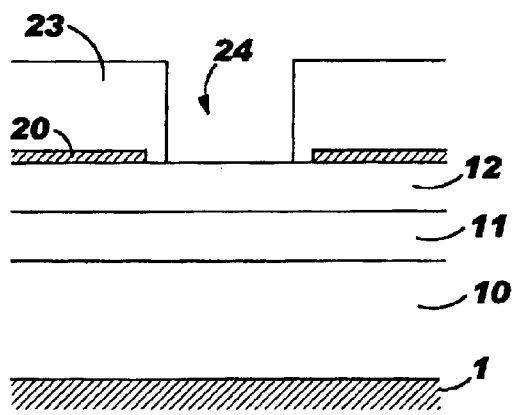

FIGS. 2B–2H illustrate steps in a dual damascene process using the hardmask of this embodiment. A resist layer 21 is applied over the hardmask, and the pattern of metal lines is developed therein. The line-level pattern is transferred to the mask by etching openings 22 in layer 20, using $Cl_2$ or $Cl_2/BCl_3$ chemistry (FIG. 2B). The resist layer 21 is then stripped and resist residues are removed, using methods known in the art. Another resist layer 23 is then applied over the mask, and the pattern of via openings 24 is developed therein (FIG. 2C). Compared to oxide layer 13, layer 20 is much less subject to faceting and introduces much less topography (compare FIGS. 1C and 2C).

Figure 2D:
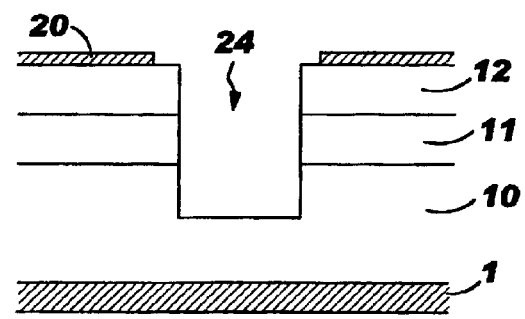
Figure 2E:
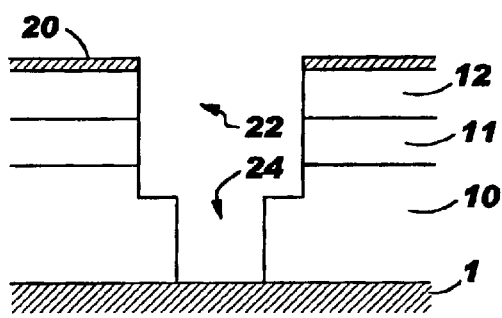

The dual-damascene pattern is transferred first to the residual hardmask, and then to the ILD, in a sequence of etching steps. Layers 11 and 12 are etched using a fluorocarbon-based chemistry. The ILD layer 10 is then partially etched using a chemistry including one or more of $O_2$, $O_3$, $SO_2$, $SO_3$, $N_2$, $NH_3$, $N_2H_2$, $N_2H_4$, $H_2$, $CO_2$, CO, $CF_4$, $CHF_3$, $CH_2F_2$ or $CH_3F$; during this etch the resist layer 23 is also removed (FIG. 2D). An additional fluorocarbon-based etch is then performed with layer 20 as a mask, opening layers 11 and 12 of the hardmask in accordance with the metal line pattern (openings 22). A further etching step, using chemistry similar to that of the previous partial via etch, transfers the line-level pattern into the ILD and completes the formation of the vias (openings 24). As shown in FIG. 2E, the metal line pattern is transferred into the upper portion of the substrate and the via pattern is transferred into the lower portion of the substrate. This etching step stops at barrier layer 1, which typically is formed of SiN or SiC. A fluorocarbon-based etch then is used to open the barrier layer, so that metallization of the via may contact the underlying level 100. The width of the opening 24 at the bottom of the via may be as small as approximately 100 nm.

Figure 2F:
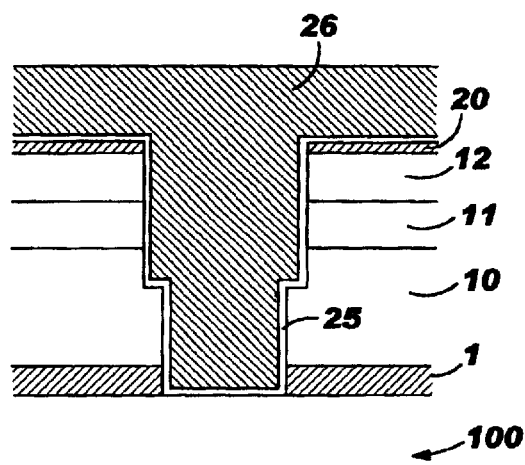
Figure 2G:
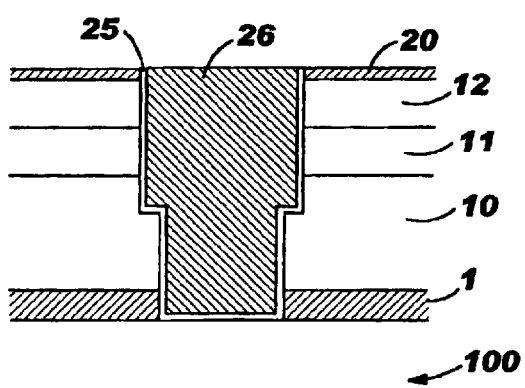
Figure 2H:
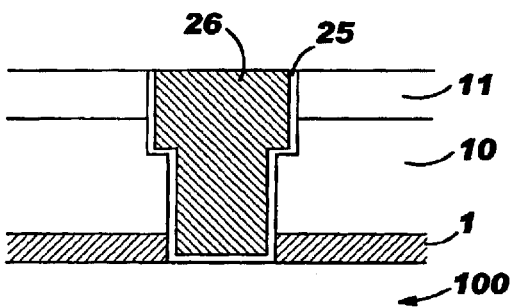

The metallization process preferably involves deposition of a liner 25, followed by deposition of metal 26 in the vias, in the metal line pattern, and over the hardmask (FIG. 2F). The excess metal is then polished away using a CMP process; the portion of the liner 25 overlying the hardmask layer 20 is generally also removed in the same CMP process. In particular, if liner 25 is W while metal 26 is Cu, a standard CMP process will not be selective between the two. It is necessary in such a case for layer 20 to serve as a polishing stop (FIG. 2G). A typical CMP process for Cu will not be stopped by W but will be stopped by Ti, Ta, TiN or TaN. Accordingly, a layer of TaN, as described in this embodiment, provides an effective polishing stop. Layer 20 is then removed in a separate polishing process. At this point it is desirable to remove layer 12 also, so that only the low-k layer 11 of the hardmask structure remains (FIG. 2H).

The hardmask structure of this embodiment provides greatly improved control of the critical dimension (metal line width and spacing) compared to the hardmask structure of FIG. 1A. In addition, the hardmask of the present embodiment provides an effective polishing stop, which in turn permits development of a more reliable CMP metal removal process.

Second Embodiment: Two-Layer Hardmask

Figure 3A:
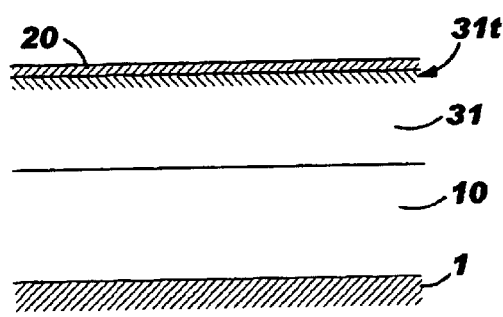
FIGS. 3A–3H illustrate a dual damascene process using a two-layer hardmask in accordance with a second embodiment of the invention.

The structure of the hardmask of this embodiment is shown in FIG. 3A. Repeated reference numerals between FIGS. 2A–2H and 3A–3H indicate corresponding structures. As in the first embodiment, a thin sacrificial hardmask layer 20 comprises the top layer of the hardmask. The material of layer 20 may be a refractory metal (e.g. Ta, Ti, W), a refractory metal nitride (e.g. TaN, TiN, WN), a refractory metal alloy (e.g. TaSiN, TiSiN, WSiN, TiW), a conductive Si-based material such as doped Si or doped amorphous Si, or some other metal (e.g. Cu, Al, Ag). A preferred material is TaN, with a thickness of about 150 Å. The underlying layer 31 is a low-k dielectric such as SiCOH or a similar material as in layer 11 of the first embodiment, with a thickness of about 500 Å.

In the present embodiment, the intermediate hardmask layer (such as nitride layer 12) is eliminated; compare FIGS. 2A and 3A. This is done by (i) treating the low-k layer 31 to make it resistant to processing damage (e.g. damage by oxidation during a resist strip process) and/or (ii) using a resist strip process which does not oxidize the exposed surface of layer 31.

Layer 31 may be deposited on the ILD layer 10 using CVD or plasma-enhanced CVD. In this embodiment, a 500 Å thickness of SiCOH is deposited by plasma-enhanced CVD. The surface of layer 31 is then exposed to a plasma (e.g. an $NH_3$ or nitride-based plasma) which causes formation of a nitride in the top surface region 31$t$ of layer 31. Alternatively, the surface of layer 31 may be exposed to a plasma treatment which densities the layer in surface region 31$t$, or layer 31 may be deposited under conditions such that the material has increased density in region 31$t$. The top surface region 31$t$ has a thickness of about 100 Å.

In another alternative, the need for plasma treatment or densification of the low-k layer 31 may be avoided by using resist strip processes which do not oxidize the surface of layer 31, as discussed in more detail below.

The top hardmask layer 20 is then deposited on layer 31; in this embodiment, a 150 Å thickness of TaN is deposited by physical vapor deposition (PVD). As noted above, layer 20 may be a metal, semiconductor or dielectric, provided that the deposition process for layer 20 does not alter the properties of layer 31, and that the polishing rate of layer 20 is low compared to that of the metal used for the conducting lines.

Figure 3B:
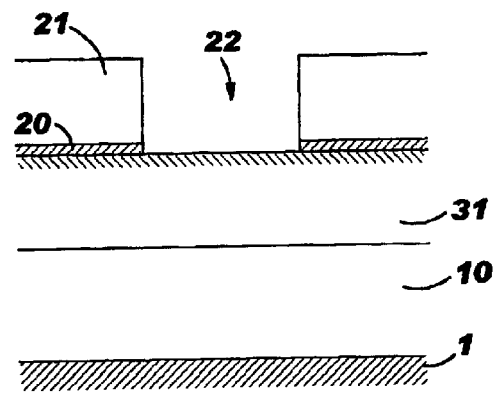

FIGS. 3B–3H illustrate steps in a dual damascene process using the two-layer hardmask of this embodiment. A resist layer 21 is applied over the hardmask; line-level patterning is then performed wherein hardmask layer 20 is patterned to produce openings 22 in accordance with the pattern of metal lines, using $Cl_2$ or $Cl_2/BCl_3$ chemistry (FIG. 3B).

The resist layer 21 is then stripped using a non-oxidizing, reducing, or mildly oxidizing plasma process. This process is preferably a plasma process with a reducing chemistry; most preferably, an $NH_3/H_2$ or $N_2/H_2$ plasma process which prevents oxidation of the exposed surface of layer 31. Alternatively, a selective solvent-based resist strip process may be used, such as an acetone-based acidic resist strip.

Figure 3C:
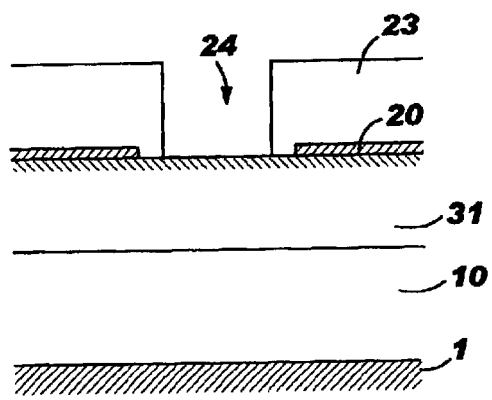
Figure 3D:
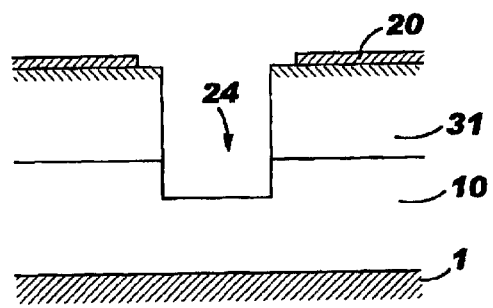
Figure 3E:
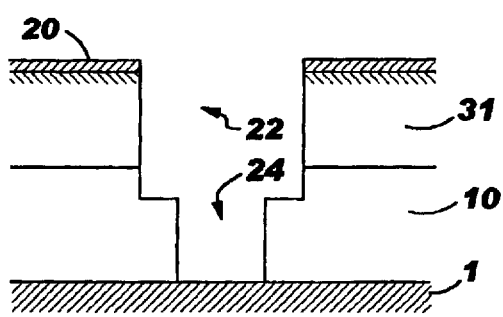

The via-level patterning is then performed, wherein resist layer 23 is applied and the pattern of via openings 24 is developed therein (FIG. 3C). As in the first embodiment, the line level pattern and via level pattern are transferred to the hardmask layer 31 and the ILD layer 10. The via pattern is etched into the SiCOH layer 31. A partial via etch is then performed, in which the via pattern is transferred into the ILD layer 10 (FIG. 3D). The resist layer 23 is also removed during this partial via etch step. An additional etch is then performed with layer 20 as a mask, opening layer 31 in accordance with the metal line pattern (thus creating openings 22 in the mask layer 31). A further etching step, using chemistry similar to that of the previous partial via etch, transfers the line-level pattern into the upper portion of the ILD and completes the formation of the vias through the lower portion of the ILD (openings 24), as shown in FIG. 3E.

Figure 3F:
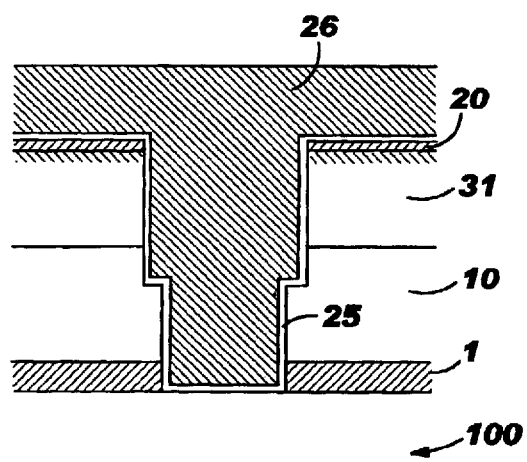
Figure 3G:
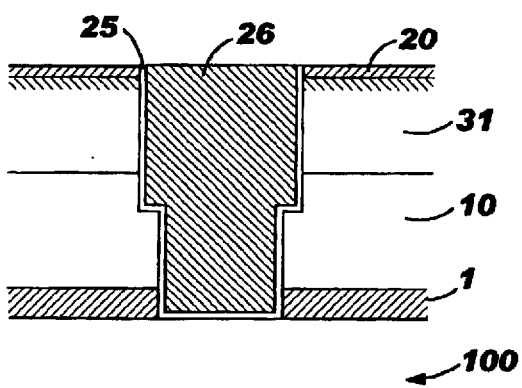
Figure 3H:
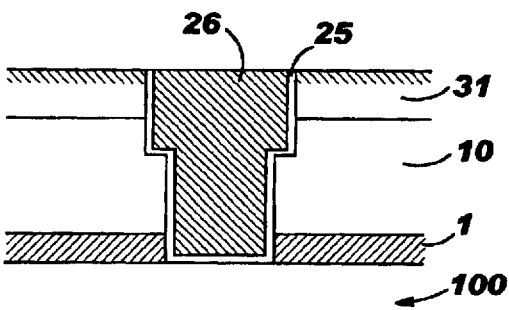

The metallization process (preferably including deposition of liner 25 and metal 26) is then performed, resulting in the structure shown in FIG. 3F. The excess metal and exposed liner are then polished away using a CMP process, with layer 20 serving as a polishing stop layer as in the first embodiment. After the excess metal is polished (FIG. 3G), layer 20 is removed in a separate polishing process to yield the structure shown in FIG. 3H. It may be desirable to also remove the surface region 31$t$ of layer 31 by CMP.

It is noteworthy that in this embodiment, the entire residual hardmask (consisting of layer 31) is a low-k material, along with the ILD layer 10.

The hardmask of the present embodiment offers all the advantages of the first embodiment, and in addition permits reduced process complexity and faster processing time, owing to the elimination of one layer from the conventional hardmask structure.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

We claim:

1. A method for forming a metal pattern in a substrate, the method comprising the steps of:

depositing a lower hardmask layer on the substrate, the lower hardmask layer having a dielectric constant less than about 4.5;

depositing a middle hardmask layer on the lower hardmask layer;

depositing a top hardmask layer on the middle hardmask layer using a vapor deposition process, the top hardmask layer having a thickness less than about 200 Å;

forming a first opening in the top hardmask layer in accordance with a first pattern, thereby exposing a portion of the middle hardmask layer;

forming a second opening in said portion of the middle hardmask layer in accordance with a second pattern and a corresponding opening in the lower hardmask layer, thereby exposing a portion of the substrate;

forming an opening in the substrate;

depositing metal in the opening in the substrate; and removing the top hardmask layer, wherein the top hardmask layer is of a material selected from the group consisting of refractory metals, refractory metal nitrides, refractory metal alloys, doped amorphous silicon and doped silicon.

2. A method according to claim 1, wherein the middle hardmask layer is of a material selected from the group consisting of $SiO_2$, SiN, SiON and SiOF.

3. A method according to claim 1, wherein the lower hardmask layer is of a material selected from the group consisting of SiC:H, SiCOH, SiCNH, carbon-doped oxide, organosilicate glass, silicon oxycarbide, amorphous hydrogenated silicon carbide and amorphous hydrogenated silicon carbide/nitride.

4. A method according to claim 1, wherein said step of depositing metal further comprises depositing excess metal overlying the top hardmask layer, and further comprising the step of removing the excess metal by polishing the metal in a chemical-mechanical polishing (CMP) process, a polishing rate of the top hardmask layer being less than a polishing rate of the metal.

5. A method according to claim 1, wherein said step of forming the first opening includes depositing a resist layer on the top hardmask layer and subsequently removing the resist layer therefrom, and wherein the middle hardmask layer protects the lower hardmask layer from oxidation during removal of the resist layer.

6. A method for forming a metal pattern in a substrate, the substrate having a dielectric constant less than about 4, the method comprising the steps of:

depositing a lower hardmask layer on the substrate, the lower hardmask layer having a dielectric constant less than about 4.5;

forming a protective layer in a region of the lower hardmask layer adjacent to a top surface thereof;

depositing a top hardmask layer on the lower hardmask layer using a vapor deposition process, the top hardmask layer having a thickness less than about 200 Å;

forming a first opening in the top hardmask layer in accordance with a first pattern, thereby exposing a portion of the lower hardmask layer;

forming a second opening in said portion of the lower hardmask layer in accordance with a second pattern, thereby exposing a portion of the substrate;

forming an opening in the substrate;

depositing metal in the opening in the substrate; and removing the top hardmask layer; wherein the material of said top hardmask layer is selected from the group consisting of refractory metals, refractory metal nitrides, refractory metal alloys, doped amorphous silicon and doped silicon.

7. A method according to claim 6, wherein the lower hardmask layer is of a material selected from the group consisting of SiC:H, SiCOH, SiCNH, carbon-doped oxide, organosilicate glass, silicon oxycarbide, amorphous hydrogenated silicon carbide and amorphous hydrogenated silicon carbide/nitride.

8. A method according to claim 6, wherein said step of depositing metal further comprises depositing excess metal overlying the top hardmask layer, and further comprising the step of removing the excess metal by polishing the metal in a chemical-mechanical polishing (CMP) process, a polishing rate of the top hardmask layer being less than a polishing rate of the metal.

9. A method according to claim 6, wherein said step of forming the first opening includes depositing a resist layer on the top hardmask layer and subsequently removing the resist layer therefrom, and said step of forming a protective layer comprises exposing the lower hardmask layer to a plasma, thereby forming a protective nitride layer in said region which protects the lower hardmask layer from oxidation during removal of the resist layer.

10. A method according to claim 6, wherein said step of forming the first opening includes depositing a resist layer on the top hardmask layer and subsequently removing the resist layer therefrom, and said step of forming a protective layer comprises exposing the lower hardmask layer to a plasma which densifies the lower hardmask layer in said region, so that the protective layer protects the lower hardmask layer from oxidation during removal of the resist layer.

11. A method according to claim 6, wherein the lower hardmask layer is deposited under conditions such that the material of the lower hardmask layer has increased density in said region adjacent to the top surface of the lower hardmask layer.

12. A method according to claim 6, wherein said step of forming the first opening includes depositing a resist layer on the top hardmask layer and subsequently removing the resist layer therefrom, and the resist layer is removed in a non-oxidizing resist strip process.

13. A method according to claim 6, wherein the protective layer has a thickness of approximately 100 Å.

14. A method for forming a metal pattern in a substrate, the substrate having a dielectric constant less than about 4, the method comprising the steps of:

depositing a lower hardmask layer on the substrate, the lower hardmask layer having a dielectric constant less than about 4.5;

depositing a top hardmask layer on the lower hardmask layer using a vapor deposition process, the top hardmask layer having a thickness less than about 200 Å;

forming a first opening in the top hardmask layer in accordance with a first pattern, thereby exposing a portion of the lower hardmask layer;

forming a second opening in said portion of the lower hardmask layer in accordance with a second pattern, thereby exposing a portion of the substrate;

forming an opening in the substrate;

depositing metal in the opening in the substrate; and removing the top hardmask layer, wherein said step of forming the first opening further comprises depositing a resist layer on the top hardmask layer and subsequently removing the resist layer therefrom, the resist layer is removed in a non-oxidizing resist strip process, and the material of said top hardmask layer is selected from the group consisting of refractory metals, refractory metal nitrides, refractory metal alloys, doped amorphous silicon and doped silicon.

15. A method according to claim 14, wherein the lower hardmask layer is of a material selected from the group consisting of SiC:H, SiCOH, SiCNH, carbon-doped oxide, organosilicate glass, silicon oxycarbide, amorphous hydrogenated silicon carbide and amorphous hydrogenated silicon carbide/nitride.

16. A method according to claim 14, wherein said step of depositing metal further comprises depositing excess metal overlying the top hardmask layer, and further comprising the step of removing the excess metal by polishing the metal in a chemical-mechanical polishing (CMP) process, a polishing rate of the top hardmask layer being less than a polishing rate of the metal.

17. A method according to claim 14, wherein the resist strip process is a plasma process with a reducing chemistry.

* * * * *